United States Patent
Peter et al.

(10) Patent No.: US 11,573,100 B2
(45) Date of Patent: Feb. 7, 2023

(54) SENSORS FOR DETERMINING AN OUTPUT VALUE, METHOD FOR EVALUATING A SENSOR SIGNAL, AND METHOD FOR TRAINING AN OUTPUT UNIT TO EVALUATE A SENSOR SIGNAL

(71) Applicant: SICK AG, Waldkirch (DE)

(72) Inventors: Andreas Peter, Emmendingen (DE); Sascha Thoss, Waldkirch (DE); Olaf Machul, Sölden (DE)

(73) Assignee: SICK AG, Waldkirch (DE)

( * ) Notice: Subject to any disclaimer, the term of this patent is extended or adjusted under 35 U.S.C. 154(b) by 179 days.

(21) Appl. No.: 17/101,994

(22) Filed: Nov. 23, 2020

(65) Prior Publication Data
US 2021/0164808 A1 Jun. 3, 2021

(30) Foreign Application Priority Data
Nov. 28, 2019 (EP) .................. 19212336

(51) Int. Cl.
*G01D 5/20* (2006.01)
*H03K 17/95* (2006.01)

(52) U.S. Cl.
CPC ............. *G01D 5/20* (2013.01); *H03K 17/952* (2013.01); *H03K 2217/95* (2013.01)

(58) Field of Classification Search
CPC ..... G01D 5/20; H03K 17/952; H03K 2217/95
USPC ....................................................... 702/158
See application file for complete search history.

(56) References Cited

U.S. PATENT DOCUMENTS 5,898,304 A * 4/1999 Mandl .................. H03K 17/945
702/170

FOREIGN PATENT DOCUMENTS

| DE | 4433772 A1 | 3/1996 |
| DE | 102017220788 A1 | 5/2019 |
| JP | H06102033 A | 4/1994 |
| JP | 2018189533 A | 11/2018 |
| WO | 2014146623 A1 | 9/2014 |

OTHER PUBLICATIONS

Search report dated Jul. 15, 2020 for corresponding European application EP 19212336.2.
Zoltán Kantor et al. "Artificial neural network assisted compact inductive distance sensor", 30th Eurosensors Conference, Eurosensors 2016.
First Office Action dated Dec. 14, 2021 for application No. JP 2020-196227.
Second Office Action dated Jul. 19, 2022 for application No. JP 2020-196227.

* cited by examiner

*Primary Examiner* — Tomi Skibinski
(74) *Attorney, Agent, or Firm* — Nath, Goldberg & Meyer; Jerald L. Meyer

(57) ABSTRACT

The invention relates to a sensor for determining an output value, the sensor having: a detection unit configured to detect a sensor signal; a preprocessing unit configured to determine an intermediate signal on the basis of the sensor signal and of a predefined reference signal; and an evaluation unit that is trained in accordance with a machine learning method and that is configured to determine the output value on the basis of the intermediate signal.

16 Claims, 4 Drawing Sheets

SENSORS FOR DETERMINING AN OUTPUT VALUE, METHOD FOR EVALUATING A SENSOR SIGNAL, AND METHOD FOR TRAINING AN OUTPUT UNIT TO EVALUATE A SENSOR SIGNAL

FIELD

The present invention relates to sensors for determining an output value, to methods for evaluating a sensor signal, and to methods for training an output unit to evaluate a sensor signal.

BACKGROUND

Sensors are often used in harsh environments. For example, inductive proximity sensors can be used as contactless switches. An important quality feature in this respect is the maximum achievable switching distance. In addition to the obvious advantage that an object can already be detected at larger distances, a high switching distance has even further advantages. The higher the switching distance of the sensor is, the larger the potential distance from the object to be detected can be. The probability of mechanical destruction is thereby reduced. A further advantage of large switching distances is the larger installation tolerance. The technician thereby does not have to work as precisely when installing the sensor, which can save time and money and can increase the availability of the system.

A further advantage is the potential for miniaturization. If a larger switching distance can be implemented for a specific sensor diameter, there is the possibility of satisfying a detection task with a smaller sensor, if applicable, which frequently has design advantages.

In addition to the magnitude of the nominal switching distance Sn, which is defined for steel, a further important quality feature of inductive proximity sensors is also the magnitude of the real switching distance that is achieved with other materials.

These switching distances are characterized by the so-called reduction factors. It also applies here that a large switching distance (or a large reduction factor) is preferred. Ideally, the sensor has the same high switching distance for any desired metals. In this case, the reduction factors have the maximum value 1 and are therefore also called F1 (factor 1) sensors.

The highest switching distances are currently, for example, achieved by sensors having plastic caps that achieve four times the value of a standard nominal switching distance in some designs. They are sensors that work in accordance with the classic quality method, such as sensors from the IME family by SICK, for example, IME08-04BPOZT0S. The disadvantage of these sensors is that they do not have an F1 behavior. Since only the amplitude of a sinusoidal oscillation at a frequency is generally available as information in these sensors, this disadvantage also cannot be eliminated by intelligent algorithms.

Sensors that work with a pulse process (in which, for example, a coil is excited by a current pulse and the pulse response, that is the voltage induced in the coil as a voltage pulse, is measured) in contrast offer the advantage that more information is included in the pulse since a pulse can be considered as a mixture of sinusoidal signals of different frequencies, amplitudes and phase positions. Accordingly, the pulse response also includes more information. Such sensors can approximately have an F1 behavior at least for steel and aluminum, but can still have a relatively high dependence on installation.

A further important property that influences the switching distance of the sensor is its sensitivity with respect to the installation. Ideally, a sensor is completely insensitive to its installation depth and to the installation material and (in the case of inductive proximity sensors) always maintains its specified switching distance.

SUMMARY

It is the object of the invention to provide a robust sensor. An inductive sensor should in particular be provided that combines the above-mentioned properties (high Sn value, F1 behavior, and low installation dependence) in one device or that is particularly good in at least one of the properties.

The object is satisfied by a sensor for determining an output value, by a method for evaluating a sensor signal, and by a method for training an evaluation unit to evaluate a sensor signal in accordance with the subject matter of the respective independent claim.

A sensor in accordance with the invention for determining an output value comprises:
- a detection unit configured to detect a sensor signal;
- a preprocessing unit configured to determine an intermediate signal on the basis of the sensor signal and of a predefined reference signal; and
- an evaluation unit that is trained in accordance with a machine learning method and that is configured to determine the output value on the basis of the intermediate signal.

In other words, in a sensor in accordance with the invention, the output value is not determined directly on the basis of the sensor signal, but rather on the basis of the intermediate signal using an evaluation unit trained in accordance with a machine learning method. For example, the method described below (method for training an evaluation unit to evaluate a sensor signal) can be used to train the evaluation unit.

It is understood that each signal (for example, the sensor signal, the reference signal, the intermediate signal) has a time development.

The sensor signal can in this respect be the signal that the sensor provides. The sensor signal can therefore be the direct object of the measurement of the sensor. For example, the sensor signal can be a voltage or a voltage curve. The sensor signal can be considered in a progressive time window (for example, a time interval of a predefined length, for example, the last 50 ms) or new time windows can be regularly determined (e.g. in a predefined time interval, e.g. every 500 ma). Alternatively, in the case of an inductive proximity sensor, the time window can, for example, be coordinated with a current pulse that induces a voltage in a coil of the inductive proximity sensor; the time window can then be selected such that it includes the complete pulse response (that is, it lasts until the induced voltage pulse has decayed completely or has decayed to a predefined voltage value) or lasts a predefined time.

The predefined reference signal can have a length that corresponds to the length of the sensor signal (that is, for example, to the length of the progressive time window or of the interval of the start of new time windows).

The output value can be the measurement variable, that is the value that is considered as the measurement and that is relevant for the user of the sensor. For example, the output value can be a number that represents the measurement result of the sensor.

By using the predefined reference signal to determine an intermediate signal and by evaluating the intermediate signal, it can be achieved that sensor-specific differences of the sensor signal have no effects or only slight effects on the output value when machine learning methods are used to determine the output value. A type-specific (that is sensor type-specific) training can thereby be sufficient and no sensor-individual training may be necessary. Therefore, the machine learning method can be trained on the basis of the measured values of only one single sensor. In addition, the trained machine learning method can then be used for each individual sensor of the same type or of a similar type. Sensor-individual training is a complex and expensive process that can practically only be carried out in the laboratory and not in real mass products. The sensor in accordance with the invention therefore reduces the manufacturing costs since training is not required for each individual sensor, but only for each sensor type (for example, only for a reference sensor).

In a further development of the invention, a separate reference pulse is recorded and stored as a reference signal for each sensor. The recording of this sensor-specific (in other words: sensor-individual) reference pulse is individually recorded and stored for each sensor during the manufacture. This process can, for example, be performed in the final inspection and is not time-consuming. The reference signal can therefore be a sensor signal of the sensor itself. The reference signal can therefore be a sensor-specific (or sensor-individual) reference signal.

The predefined reference signal can (in particular in the training, as described below) have a sensor signal of a reference sensor. The sensor and the reference sensor can be of the same construction or of the same type.

The preprocessing unit can be configured to determine at least one intermediate signal on the basis of the sensor signal and of at least one predefined reference signal that is selected from a plurality of reference signals. In this respect, the plurality of reference signals can include different reference signals that were determined under different conditions (e.g. for different installation situations or for different target materials). The preprocessing unit can then select a reference signal from this plurality of reference signals (for example, a selection device can be attached to the sensor, for example a switch or a plurality of switches, for example a DIP (dual in-line package) switch) via which the user can set the installation situation and/or the desired target material. Alternatively, the preprocessing unit can determine the output value for two or more of the reference signals (for example, for all the reference signals) and can then determine a suitable output value from the plurality of output values obtained in this manner (for example, via a minimum formation or another suitable (e.g. mathematical) function).

The predefined reference signal can be stored in a memory. This memory can be directly included in the sensor. Alternatively, the memory can be included in an apparatus that is provided for a further processing of the output value. The memory can be a read-only memory or a volatile memory. The memory can be written at the production time of the sensor.

The tolerances of the sensor (such as gain factors or a coil position) indeed have an influence on the training data and thus later on the classification and regression results of the machine learning methods in the inference phase (i.e. in the phase of the use of the trained machine learning method), but these influences can be reduced by the use of a predefined reference signal and by the use of the evaluation unit on the basis of the intermediate signal.

The detection unit is preferably configured for digitizing the sensor signal. For example, the pulse response can be completely digitized. Due to a digitizing of the sensor signal, a digital signal processing can be used to determine the output value. Machine learning methods can, for example, be used to evaluate the pulse response after preprocessing, that is to evaluate the intermediate signal.

In accordance with an advantageous design of the sensor, the preprocessing unit can further be configured to preprocess the sensor signal on the basis of a transformation and/or of a linear principal component analysis and/or of a linear discriminant analysis.

The sensor signal can thus be preprocessed before the intermediate signal is determined. For example, the sensor signal can be prepared by the preprocessing such that using the sensor signal in a calculation together with the predefined reference signal is efficiently possible, wherein the calculation yields the intermediate signal.

The predefined reference signal can therefore be clearly understood as the sensor signal of the sensor under predefined conditions. These conditions correspond to the conditions that were used to determine the reference signal of the reference sensor that was used for the training. By determining the intermediate signal on the basis of the sensor signal (that is on the basis of the pulse response recorded in each case by the individual sensor under the conditions to be evaluated; that is the conditions in real use) and on the basis of the predefined reference signal (that is, for example, on the basis of the sensor signal recorded by the individual sensor under the training conditions (for example, reference conditions)), it is possible to compensate disturbing sensor-individual features such as production tolerances so that a sensor-individual training of a machine learning method can be dispensed with.

In an advantageous design of the sensor, the preprocessing unit can be configured to determine the intermediate signal on the basis of a difference between the sensor signal and the predefined reference signal.

A simple determination of the intermediate signal is possible due to the difference formation, wherein the intermediate signal is nevertheless suitable to reliably obtain the output value when the evaluation unit is used.

For example, the evaluation unit can perform at least one Gaussian process regression and/or can have at least one support vector machine and/or at least one decision tree and/or at least one artificial neural network and/or at least one linear model.

In this respect, the machine learning methods for processing the intermediate signal may have been trained or configured on the basis of data that originate from a reference sensor or a prototype of the sensor (that is from a single sensor of the same type as the sensor). A training or configuration is therefore not necessary for each individual sensor (that is every single sensor). It may be sufficient to only determine the reference signal in a sensor-specific manner and to make it available for the evaluation in a memory, for example.

The machine learning method used in the evaluation unit was therefore trained once before the productive use of the sensor. The machine learning method and thus the evaluation unit are then no longer changed, in particular in productive use.

The sensor can in particular be an inductive proximity sensor. The sensor can have at least one coil and means for feeding the at least one coil. The output value can represent a distance of an object, for example a (e.g. metallic) target or an object to be detected, from the sensor.

It has been shown that inductive proximity sensors in particular respond sensitively to fluctuations, for example, in the sensor dimensions based on the production tolerances. The effects of these fluctuations can be at least largely eliminated by the use in accordance with the invention of an intermediate signal.

The distance can in this respect be a distance in a unit of length (for example, in meters or millimeters), or it can be a fuzzy value (such as "so far away that it cannot be detected", "in the immediate vicinity", "very close or touching"), or it can be a binary value (for example, "target detected in the distance measurement range" and "no target detected in the distance measurement range").

The object of the invention is furthermore satisfied by a method for evaluating a sensor signal comprising the following steps:
  detecting a sensor signal;
  determining an intermediate signal on the basis of the sensor signal and of a predefined reference signal; and
  determining an output value on the basis of the intermediate signal by means of an evaluation unit trained in accordance with a machine learning method.

The object of the invention is furthermore satisfied by a method for training an evaluation unit (for example; the evaluation unit of the sensor in accordance with the invention or of the method in accordance with the invention for evaluating a sensor signal) to evaluate a sensor signal, said method comprising the following steps:
  providing a plurality of training sensor signals; wherein a corresponding training output value is associated with each training sensor signal;
  determining an intermediate signal for each training sensor signal, said intermediate signal being associated with the respective training sensor signal, on the basis of the respective training sensor signal and of a predefined reference signal;
  determining an output unit output value for each training sensor signal, said output unit output value being associated with the respective training sensor signal, on the basis of the intermediate signal associated with the respective training sensor signal using the evaluation unit; and
  training the evaluation unit on the basis of the output unit output values and of the training output values.

The training sensor signals and the respective corresponding training output values can in this respect be determined in advance in that sensor signals are measured for a sensor (for example, for a reference sensor or a prototype of the sensor whose sensor signal is to be evaluated later) under predefined external conditions that enable a determination of the respective ideal output value via a suitable other measuring instrument. The measurement variable can therefore be known, for example, by a measurement via the suitable other measuring instrument. The known measurement variable can then be associated with the sensor signal provided by the sensor. An ideal sensor would therefore provide a pulse response when a situation is present that corresponds to the measurement variable, said pulse response delivering the measurement variable as an output value after the use in the evaluation unit.

It can be ensured by the training of the evaluation unit that the correct output values (that is the training output values associated with the training sensor signals) are at least determined for sensor signals that are identical to the training sensor signals. In the case of a good training, the evaluation unit will then also determine good output values for sensor signals that are not identical to the training sensor signals.

The training of the evaluation unit advantageously comprises determining parameters used in the evaluation unit to determine the output unit output values.

The parameters can in this respect define the structure of the output unit and/or internal parameters of the output unit. For example, in a design of the output unit as a neural network having a predefined structure, the parameters can be weights within the neural network.

In an advantageous design of the method, the parameters are determined by means of an optimization method. It can be ensured by the use of an optimization method that the parameters are determined such that the evaluation unit at least determines the best possible output values (that is output values that lie as close as possible to the training output values) for the training sensor signals. These parameters can then also be well suited to determining output values on the basis of sensor signals in real operation, that is determining output values on the basis of sensor signals that do not correspond to the training sensor signals.

With the sensors and methods in accordance with the invention, inductive sensors having high switching distances (for example, having at least four times the switching distance, that is, for example, four times the nominal distance in accordance with the standard, for example, 8 mm for an M12 flush sensor) can, for example, be provided that at least have an F1 behavior on aluminum and steel. In addition, the high switching distance of inductive sensors can be achieved independently of their installation depth and installation material.

The evaluation of the sensor signal (for example, of the pulse response) using machine learning methods has the great advantage that a switching signal (in other words: an output value) can thus be generated that is almost independent of the material of the target (for example, of the object whose distance is to be determined) and of the installation situation and that has very high switching distances.

The preprocessing in accordance with the invention additionally allows the machine learning method to be trained only once in the laboratory for a specific sensor type (that is only for a single reference sensor) and not individually for each sensor. A use in mass production thereby becomes sensibly possible in the first place.

More information can be obtained by the processing of the sensor signal (for example, by the processing of a pulse response) using machine learning methods than by using e.g. only one integral value since the machine learning method can offset and combine the sampled values with one another as desired (that is the values of the time development at a plurality of points in time at which the sensor signal is detected or sampled).

Furthermore, it is possible by the use in accordance with the invention of the evaluation unit to recognize the target material in order e.g. to generate a material-independent switching point (F1 behavior). Equally, it is also possible e.g. to completely mask non-ferrous metals so that the sensor only responds to ferromagnetic materials.

It is likewise possible by the use in accordance with the invention of the evaluation unit to mask disturbing influences of the environment and thus to achieve a uniformly high switching distance for all installation situations.

Advantages, details, and preferred embodiments that are described for the sensor also apply to the method for evaluating a sensor signal and to the method for training an evaluation unit to evaluate a sensor signal, and vice versa.

Further advantageous embodiments of the method in accordance with the invention result from the dependent claims, from the drawing, and from of the description.

BRIEF DESCRIPTION OF THE DRAWINGS

The invention will be described in the following with reference to embodiments and to the drawing, There are shown in schematic representations.

DETAILED DESCRIPTION

In the following, the sensors and methods in accordance with the invention will be explained in an exemplary manner with reference to an embodiment.

Figure 1:
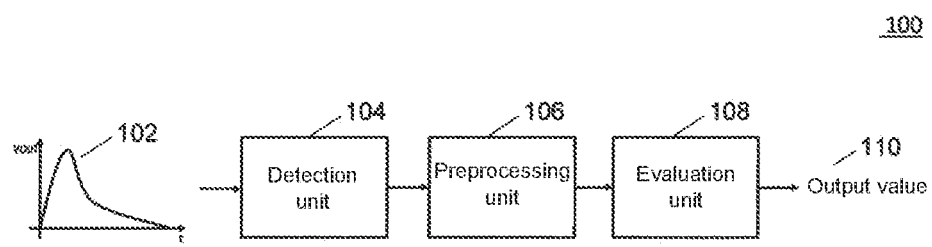
FIG. 1 a block diagram of a sensor in accordance with an embodiment.

FIG. 1 shows a block diagram 100 of a sensor (for example, of distance sensor) in accordance with an embodiment. A sensor signal 102 is detected in a detection unit 104. The detection unit 104 can be configured as a digitizing unit to digitize the sensor signal 102. The digitized sensor signal is preprocessed in a preprocessing unit 106. For example, an intermediate signal can be determined in the preprocessing unit 106 on the basis of the digitized sensor signal and of a predefined reference signal. The intermediate signal can be processed in an evaluation unit 108, which can, for example, be designed as a machine learning unit (that is as a unit for machine learning), in order to determine an output value 110 (in the case of a distance sensor, for example, a target distance).

The sensor can be an inductive proximity sensor having at least one coil and means for feeding the coil with at least one transmission current pulse. For example, the transmission current pulse can at least approximately have a rectangular shape, but can also have any other shape. The detection unit 104 can be configured for a complete or partial digitizing of the induced voltage pulse that results from the current pulse at the coil. The detection unit 104 digitizes the voltage pulse from the application of the current pulse up to the complete decaying or partial decaying (for example, to a predefined level) of the voltage pulse. The voltage pulse can also be designated as a pulse response. The evaluation unit 108 may have been trained using methods of machine learning. By using the preprocessing unit 106, sensor-individual features can be at least largely eliminated by one or more preprocessing steps and the results of the evaluation unit 108 can be improved.

The individual sampled values (that is the digitized sensor signals for the individual time steps) can, for example, be preprocessed in the preprocessing unit 106 by: an offsetting against a stored reference signal, and/or a scaling, and/or a transformation (e.g. discrete cosine transformation; DCT) and/or a principal component analysis (PCA), and/or a linear discriminant analysis (LDA).

The preprocessed sampled values can, for example, be evaluated in the evaluation unit 108 by a Gaussian process regression, and/or an ensemble of Gaussian process regression, and/or a support vector machine, and/or an ensemble of support vector machines, and/or a decision tree, and/or an ensemble of decision trees, and/or an artificial neural network, and/or an ensemble of artificial neural networks, and/or a linear model, and/or an ensemble of linear models, and/or an ensemble of the above methods.

An advantageous embodiment of the preprocessing is the offsetting of the recorded pulse response against at least one stored pulse response that originates from the measurement of this sensor in a defined environment (e.g. a defined installation, installation material, target distance, target material). The defined environment can be identical or similar to the environment that was used to determine the stored pulse response (reference signal) of the reference sensor that was used for the training. More than one stored pulse response can e.g. be used if two different reference pulses were determined and stored for different target materials and the determination of the output value then takes place on the basis of the two different reference pulses. In this respect, a difference formation can, for example, be calculated between the detected or recorded (current) pulse response and the stored pulse response and a machine learning method can be applied to this difference. Large parts of the influence of production tolerances can thus be eliminated.

Furthermore, not all possible information, but substantially only the information that is relevant and significant for the decision, is provided to the machine learning method by the preprocessing in accordance with the invention. An overfitting is thereby prevented and the machine learning method becomes better in a generalized manner if it receives as input unknown data or data that has e.g. been slightly modified by production tolerances.

An additional advantageous preprocessing step can be the scaling of the measured values or a transformation or a principal component analysis.

For example, in the preprocessing unit 106, a difference (as an intermediate signal) can be determined from the digitized sensor signal and from a predefined reference signal and the further processing can then take place on the basis of this difference.

Figure 2A:
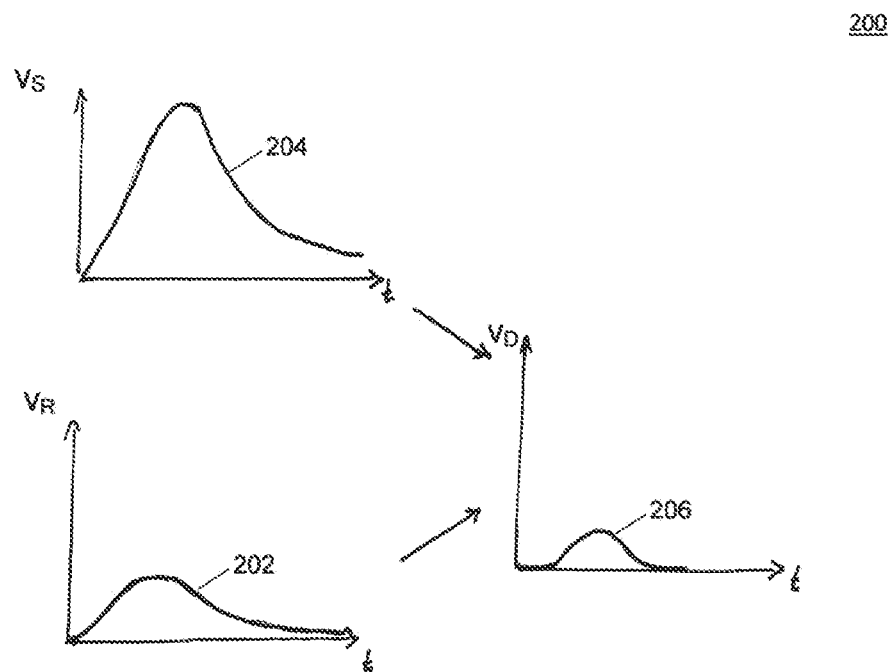
FIG. 2A an illustration of the determination of an intermediate signal in accordance with an embodiment.

FIG. 2A shows an illustration 200 of a determination of the intermediate signal in accordance with an embodiment. The sensor signal $v_s$ 204 and the predefined reference signal $v_R$ 202 can be processed such that a difference signal 206 is determined, wherein the difference signal $v_D$ specifies for each time step t the difference of the sensor signal $v_s$ at this time step t and of the reference signal $v_R$ at this time step t:

$$v_D(t)=v_S(t)-v_R(t).$$

The time development of the difference can be processed by the evaluation unit 108 and thus using methods of machine learning.

Figure 2B:
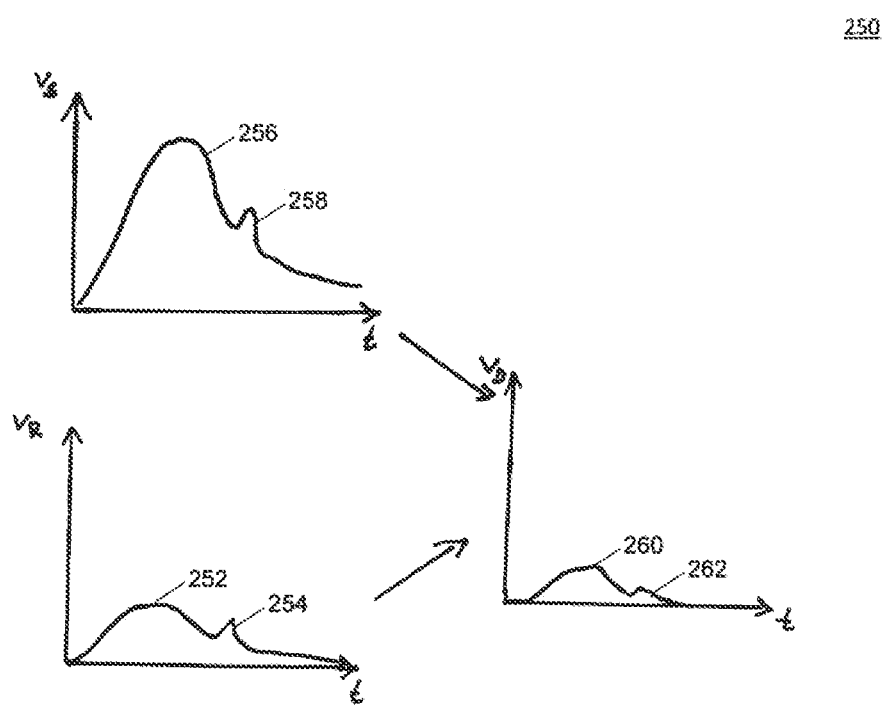
FIG. 2B an illustration of the reduction of deviations, caused by tolerances, of the intermediate signal in accordance with an embodiment.

FIG. 2B shows an illustration 250 of the reduction of deviations, caused by tolerances, of the intermediate signal in accordance with an embodiment. A sensor signal 256 recorded in the actual operation can, for example due to production tolerances, have a deviation 258, caused by tolerances, from an ideal sensor signal. The reference signal 252 that is used to determine the difference signal 260 can be a signal generated by the sensor under predefined conditions, i.e. the reference signal 256, just like the sensor signal 256 recorded in the actual operation, shows a deviation, for example a deviation 254 caused by tolerances. The deviation 254, caused by tolerances, of the reference signal 256 does not have to be identical to the deviation 258, caused by tolerances, of the sensor signal 256 recorded in the actual operation, but it will at least be similar. The effect of the deviation 258 caused by tolerances can thereby be reduced in the difference signal 260 so that a deviation difference 262 is considerably smaller than the deviation 258 caused by tolerances.

It is understood that even though a peak in the decaying signal is illustrated as the deviation caused by tolerances in FIG. 2B, the deviation caused by tolerances can also have other effects, for example, a change in the maximum value of the sensor signal 256 or a change in the decay duration of the sensor signal 256. However, the deviation 254, caused by tolerances, of the reference signal 256 is in any case at least similar to the deviation 258, caused by tolerances, of the sensor signal 256 recorded in the actual operation so that a deviation (in other words: a deviation difference 262) in the difference signal 260 can be considerably reduced. This can facilitate a training for machine learning methods on the basis of the difference signal 260 or can improve the results of a machine learning method on the basis of the difference signal 260 in comparison with machine learning methods that directly use the sensor signal 256.

Figure 3:
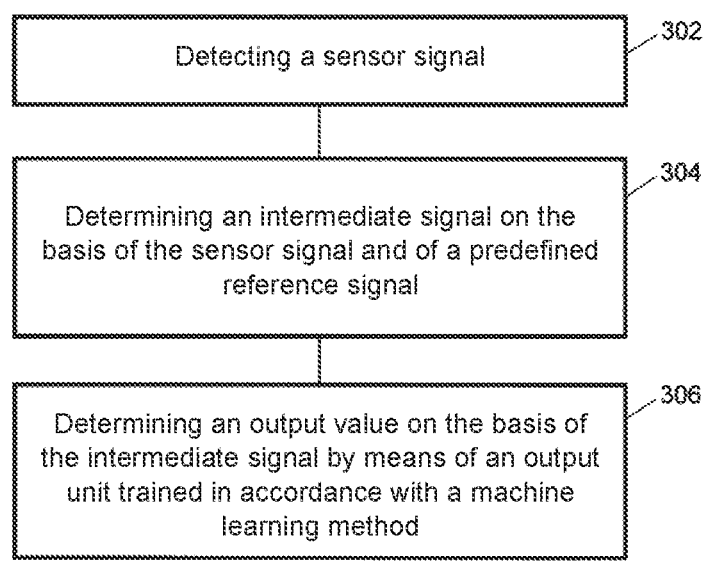
FIG. 3 a flowchart that illustrates a method for evaluating a sensor signal in accordance with an embodiment.

FIG. 3 shows a flowchart 300 that illustrates a method for evaluating a sensor signal in accordance with an embodiment. A sensor signal can be detected in 302. In 304, an intermediate signal can be determined on the basis of the sensor signal and on the basis of a predefined reference signal. In 306, an output value can be determined on the basis of the intermediate signal by means of an evaluation unit trained in accordance with a machine learning method.

Figure 4:
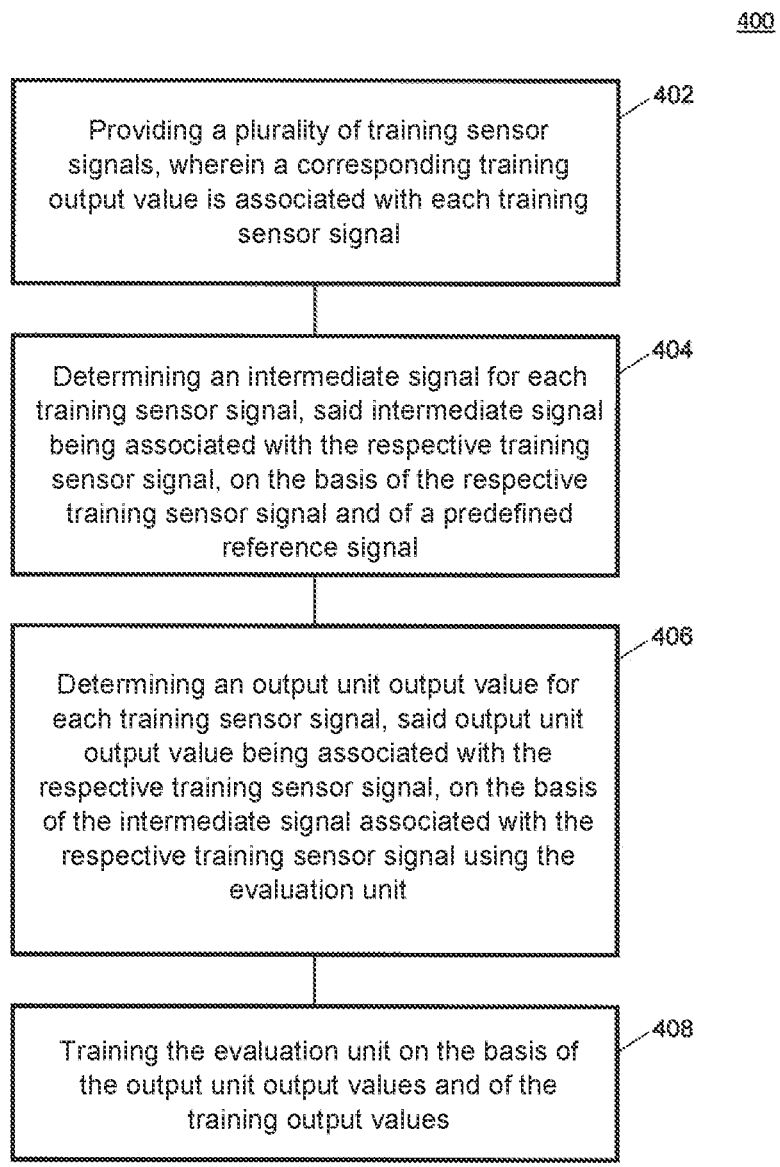
FIG. 4 a flowchart that illustrates a method for training an evaluation unit to evaluate a sensor signal in accordance with an embodiment.

FIG. 4 shows a flowchart 400 that illustrates a method for training an evaluation unit to evaluate a sensor signal in accordance with an embodiment. In 402, a plurality of training sensor signals can be provided, with a corresponding training output value being associated with each training sensor signal. In 404, an intermediate signal can be determined for each training sensor signal, said intermediate signal being associated with the respective training sensor signal, on the basis of the respective training sensor signal and of a predefined reference signal. In 406, an output unit output value can be determined for each training sensor signal, said output unit output value being associated with the respective training sensor signal, on the basis of the intermediate signal associated with the respective training sensor signal using the evaluation unit. In 408, the evaluation unit can be trained on the basis of the output unit output values and of the training output values.

The predefined reference signal used in the method for evaluating the sensor signal may have been recorded sensor-individually under similar or identical conditions to the predefined reference signal of the reference sensor that is used in the method for training an evaluation unit to evaluate a sensor signal in accordance with an embodiment.

REFERENCE NUMERAL LIST 100 block diagram
102 sensor signal
104 detection unit
106 preprocessing unit
108 evaluation unit
110 output value
200 illustration of a determination of the intermediate signal
202 predefined reference signal
204 sensor signal
206 difference signal
250 illustration of a reduction of deviations caused by tolerances
252 predefined reference signal
254 deviation caused by tolerances
256 sensor signal
258 deviation caused by tolerances
260 difference signal
262 deviation difference
300 flowchart that illustrates a method for evaluating a sensor signal in accordance with an embodiment
302 method step
304 method step
306 method step
400 flowchart that illustrates a method for training an evaluation unit to evaluate a sensor signal in accordance with an embodiment
402 method step
404 method step
406 method step
408 method step

The invention claimed is:

1. A sensor for determining an output value comprising:
a detection unit configured to detect a sensor signal;
a preprocessing unit configured to determine an intermediate signal on the basis of the sensor signal and of a predefined reference signal, wherein the predefined reference signal comprises a sensor signal of the sensor and/or a sensor signal of a reference sensor; and
an evaluation unit that is trained in accordance with a machine learning method and that is configured to determine the output value on the basis of the intermediate signal.

2. The sensor in accordance with claim 1, wherein the sensor is an inductive proximity sensor.

3. The sensor in accordance with claim 1, wherein the detection unit is configured to digitize the sensor signal.

4. The sensor in accordance with claim 1, wherein the preprocessing unit is configured to preprocess the sensor signal on the basis of at least one of a transformation, a linear principal component analysis and a linear discriminant analysis.

5. The sensor in accordance with claim 1, wherein a separate reference pulse is recorded and stored as a reference signal for each sensor.

6. The sensor in accordance with claim 1, wherein the preprocessing unit is configured to determine at least one intermediate signal on the basis of the sensor signal and of at least one predefined reference signal that is selected from a plurality of reference signals.

7. The sensor in accordance with claim 1, wherein the preprocessing unit is configured to determine the intermediate signal on the basis of a difference between the sensor signal and the predefined reference signal.

8. The sensor in accordance with claim 1, wherein the evaluation unit performs at least one Gaussian process regression and/or has at least one support vector machine and/or at least one decision tree and/or at least one artificial neural network and/or at least one linear model.

9. The sensor in accordance with claim 1, further comprising:
at least one coil; and
means for feeding the at least one coil.

10. The sensor in accordance with claim 1, wherein the output value represents a distance of an object from the sensor.

11. The method for evaluating a sensor signal in accordance with claim 1, which is a method for evaluating a sensor signal of an inductive proximity sensor.

12. A method for evaluating a sensor signal, in particular a method for evaluating a sensor signal of an inductive proximity sensor, the method comprising:
 detecting a sensor signal;
 determining an intermediate signal on the basis of the sensor signal and of a predefined reference signal, wherein the predefined reference signal comprises a sensor signal of the sensor and/or a sensor signal of a reference sensor; and
 determining an output value on the basis of the intermediate signal by means of an evaluation unit trained in accordance with a machine learning method.

13. A method for training an evaluation unit to evaluate a sensor signal, the method comprising:
 providing a plurality of training sensor signals, wherein a corresponding training output value is associated with each training sensor signal;
 determining an intermediate signal for each training sensor signal, said intermediate signal being associated with the respective training sensor signal, on the basis of the respective training sensor signal and of a predefined reference signal, wherein the predefined reference signal comprises a sensor signal of the sensor and/or a sensor signal of a reference sensor;
 determining an output unit output value for each training sensor signal, said output unit output value being associated with the respective training sensor signal, on the basis of the intermediate signal associated with the respective training sensor signal using the evaluation unit; and
 training the evaluation unit on the basis of the output unit output values and of the training output values.

14. The method in accordance with claim 13, which is a method for training an evaluation unit to evaluate a sensor signal of an inductive proximity sensor.

15. The method in accordance with claim 13, wherein the training of the evaluation unit comprises determining parameters used in the evaluation unit to determine the output unit output values.

16. A method in accordance with claim 15, wherein the parameters are determined by means of an optimization method.

\* \* \* \* \*